US 9,182,686 B2

(12) United States Patent
Goldfarb (10) Patent No.: US 9,182,686 B2
(45) Date of Patent: Nov. 10, 2015

(54) EXTREME ULTRAVIOLET RADIATION (EUV) PELLICLE FORMATION APPARATUS

(71) Applicant: International Business Machines Corporation, Armonk, NY (US)

(72) Inventor: Dario L. Goldfarb, Dobbs Ferry, NY (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 236 days.

(21) Appl. No.: 13/916,939

(22) Filed: Jun. 13, 2013

(65) Prior Publication Data

US 2014/0367248 A1     Dec. 18, 2014

(51) Int. Cl.
| | |
|---|---|
| *C25B 9/00* | (2006.01) |
| *C25B 9/18* | (2006.01) |
| *C25D 17/00* | (2006.01) |
| *C25D 17/08* | (2006.01) |
| *C25C 7/02* | (2006.01) |
| *C25C 3/10* | (2006.01) |
| *C25F 7/00* | (2006.01) |
| *G03F 7/20* | (2006.01) |

(Continued)

(52) U.S. Cl.
CPC .......... *G03F 7/70983* (2013.01); *C25D 11/005* (2013.01); *C25D 11/32* (2013.01); *C25D 17/008* (2013.01); *C25D 17/06* (2013.01)

(58) Field of Classification Search
CPC ............ C25B 9/00; C25B 9/18; C25D 17/06; C25D 17/00; C25D 17/08; C25C 7/02; C25C 3/10; C25F 7/00; H01M 4/8803; H01M 8/248; H01M 2/202; H01M 8/247; H01M 10/058; H01M 10/04

USPC ............ 204/242, 286.1, 288.1; 429/469, 470, 429/508, 100, 138, 186, 237
See application file for complete search history.

(56) References Cited

U.S. PATENT DOCUMENTS

| | | | |
|---|---|---|---|
| 5,928,817 | A | 7/1999 | Yan et al. |
| 6,253,464 | B1 | 7/2001 | Klebanoff et al. |

(Continued)

FOREIGN PATENT DOCUMENTS

| | | |
|---|---|---|
| EP | 2124102 A2 | 11/2009 |
| EP | 2051139 B1 | 11/2010 |

(Continued)

OTHER PUBLICATIONS

Ducso et al., "Porous Silicon Bulk Micromachining for Thermally Isolated Membrane Formation," Sensors and Actuators A 60, pp. 235-239, 1997.

(Continued)

*Primary Examiner* — Zulmariam Mendez
(74) *Attorney, Agent, or Firm* — Michael LeStrange; Hoffman Warnick LLC (57) ABSTRACT

Spacers arranged on opposite sides of an article to be processed into an EUV pellicle support the article. Plates on opposite ends of the spacer-article combination include respective electrodes. The plates, article, and spacers can be held together with a vacuum retention system. A center hole of each spacer forms a chamber with surfaces engaged by the spacer. A fluid entry extending from an outer surface of each spacer to its center hole allows delivery of fluid to each chamber. Additional spacers can be used to support additional articles. Additional plates and electrodes can also be used.

20 Claims, 9 Drawing Sheets

(51) Int. Cl.
*C25D 11/32* (2006.01)
*C25D 17/06* (2006.01)
*C25D 11/00* (2006.01)

(56) References Cited

U.S. PATENT DOCUMENTS

| | | |
|---|---|---|
| 6,492,067 B1 | 12/2002 | Klebanoff et al. |
| 6,623,893 B1 | 9/2003 | Levinson et al. |
| 6,646,720 B2 | 11/2003 | Ramamoorthy et al. |
| 6,852,205 B1 * | 2/2005 | Toyoshima ............... C25B 9/20 204/253 |
| 7,153,615 B2 | 12/2006 | Bristol et al. |
| 7,413,586 B2 | 8/2008 | Ramamoorthy et al. |
| 7,666,555 B2 | 2/2010 | Goldstein et al. |
| 7,723,704 B2 | 5/2010 | Wood, II et al. |
| 7,767,985 B2 | 8/2010 | Okoroanyanwu et al. |
| 7,901,846 B2 | 3/2011 | Kubota et al. |
| 7,911,588 B2 | 3/2011 | Yonekawa et al. |
| 7,919,217 B2 | 4/2011 | Kubota et al. |
| 7,951,513 B2 | 5/2011 | Kubota et al. |
| 8,018,578 B2 | 9/2011 | Banine et al. |
| 2004/0173454 A1 * | 9/2004 | Olgado ................. C25D 5/028 204/297.03 |
| 2011/0065278 A1 | 3/2011 | Kim |
| 2012/0045714 A1 | 2/2012 | Akiyama et al. |
| 2012/0183757 A1 | 7/2012 | Akiyama et al. |

FOREIGN PATENT DOCUMENTS

| | | |
|---|---|---|
| EP | 2113809 B1 | 6/2011 |
| EP | 2423747 A1 | 2/2012 |
| EP | 2477072 A1 | 7/2012 |
| EP | 2518563 A1 | 10/2012 |

OTHER PUBLICATIONS

Akiyama et al., "Realization of EUV Pellicle with Single Crystal Silicon Membrane," Presentation to 2009 International EUVL Symposium, Prague, Czech, 2009.

Rosasco, Notice of Allowance and Fee(s) Due for U.S. Appl. No. 13/916,946 dated Feb. 27, 2015. 19 pages.

Kang et al., "Novel Method of Thick Porous Silicon Membrane Formation", International Conference on Electrical Engineering 2002.

Ko et al., "Effect of Extreme-ultraviolet Pellicle Support to Patterned Mark", Proc. of SPIE vol. 8322, 2012.

Velleman et al., "Fabrication of self-supporting porous silicon membranes and tuning transport properties by surface functionalization", Nanoscale, 2010, 2, 1756-1761.

Moors et al., "Electricostatic mask protection for extreme ultraviolet lithography", Journal of Vacuum Science and Technology B, 20, 316, 2002.

Oh, Hye-Keun, "EUV Pellicles" Hanyang University, Oct. 23, 2012.

Scaccabarozzi et al, "Investigation of EUV pellicle feasibility", Proc. of SPIE vol. 8679, 2013.

Shroff et al., "EUV Pellicle Development for Mask Defect Control", Proc. of SPIE, vol. 6151, 2006.

Shroff et al., "High transmission pellicles for extreme ultraviolet lithography reticle protection", Journal of Vacuum Science and Technlogy B, 28(6), Nov./Dec. 2010.

Arrand, "Porous Silicon", Chapter 2, Optical Wavguides and Components Based on Porous Silicon, 1997, http://www.nottingham.ac.uk/ggiemr/publications/hfa_thesis.htm.

* cited by examiner

EXTREME ULTRAVIOLET RADIATION (EUV) PELLICLE FORMATION APPARATUS

BACKGROUND

The present invention relates to photolithography used in the microfabrication of semiconductor devices, and, more specifically, to methods of forming a porous silicon film, particularly for use as a pellicle to protect an extreme ultraviolet radiation photomask or reticle.

It is common to employ ultraviolet (UV) radiation in photolithography to transfer a pattern onto an article to be processed, such as a semiconductor wafer. As semiconductor devices continue to be reduced in scale, shorter wavelengths of radiation are preferred. As a result, extreme ultraviolet (EUV) radiation can be used in the microfabrication of semiconductor devices to form components and/or patterns at even smaller scales than more conventional UV photolithography allows, such as features with dimensions in the order of 20 nanometers (nm) or smaller. EUV is often regarded as including wavelengths of from about 4 nm to about 40 nm, which roughly corresponds to frequencies of about 75 peta-Hertz (PHz) to about 7.5 PHz and/or photon energies of from about 310 electron-volts (eV) to about 31 eV. However, EUV light is highly absorbed by most known materials, which can result in flaws in pattern transfer should undesired particles lay between the EUV radiation source and the photomask and/or the article to be patterned. This is exaggerated in EUV photolithography since radiation is reflected off the photomask instead of shone from behind the photomask, potentially creating twice as much risk of a particle entering the path of the radiation. To reduce introduction of such particles, a shield or the like called a pellicle can be placed in front of a photomask, but such a pellicle can result in significant reduction in EUV radiation transmittance to the photomask and article.

One approach to avoid EUV radiation transmittance reduction is to create a thermal gradient over an article to be processed and/or the photomask, which can avoid use of a pellicle at all. The article, photomask, and/or support structure is heated so that convection currents can form and flow away from the photomask, carrying undesirable particles away, as well. However, this approach may not be as effective in processes in which vacuum is employed. In addition, should gas or particles surround the photomask, the convection currents could draw particles to the photomask.

A related approach is to place an electrostatic charge on the photomask, the article to be processed, and/or support structure. By using a charge similar to that possessed by undesirable particles, the particles can be repelled. This approach may not be as effective where particles of mixed charges are present and/or where a charge could damage the photomask, support structure, and/or article.

Another approach is to use a pellicle, but to remove the pellicle just before exposing the photomask. The photomask in this example is typically in a box sealed by a removable pellicle. The box is inserted into a vacuum chamber in which the article is to be exposed to EUV radiation, the pellicle is removed, the article is exposed, the pellicle is replaced, and the box is withdrawn. This approach may not be effective against particles produced from rubbing parts of the box or elsewhere in the vacuum chamber during exposure.

A further approach is to form a permanent pellicle on the box from a highly EUV transmissive material. For example, a very thin layer or film of a material, such as silicon, can be highly transmissive of EUV radiation and used as a pellicle to cover a photomask box. Similarly, an aerogel membrane of a material, such as silicon, can be formed as a highly EUV transmissive pellicle for a photomask box. Such pellicles typically are very thin and/or of very low density, however, which can result in undesirable deflection and/or breakage.

SUMMARY

According to one embodiment of the present invention, an apparatus for processing an article into an extreme ultraviolet (EUV) pellicle for protection of a photomask can include a first plate including a first electrode arranged for connection to a voltage source and a first spacer having a center hole and opposed first and second engagement surfaces. The first engagement surface can engage the first plate and the second engagement surface can engage a first frame supporting the article, thereby forming a first chamber. A second spacer substantially identical to the first spacer can include a first engagement surface that can engage the frame and a second engagement surface that can engage a second plate to form a second chamber. The second plate can include a second electrode arranged for connection to the voltage source. First and second substantially concentric, substantially coplanar seals spaced apart in respective first and second grooves in each of the first and second engagement surfaces of the first and second spacers can substantially prevent fluid leakage from the first and second chambers. The first and second plates and the frame can be retained in engagement with the first and second spacers with a vacuum passage in each spacer extending from a respective outer surface toward the respective center hole and in fluid communication with a region of each of the respective first and second engagement surfaces between the respective first and second seals.

Another embodiment of the invention disclosed herein can take the form of an apparatus for processing an article to form a pellicle for protecting a photomask and can include a support structure that can support a first frame supporting the article. The support structure can include first and second substantially identical, substantially annular spacers arranged to engage and hold the first frame therebetween, each spacer including opposed engagement surfaces. A first plate can be engaged by a first engagement surface of the first spacer, and a second plate can be engaged by a second engagement surface of the second spacer. A retention system can include a vacuum supply in fluid communication with a respective region of each engagement surface of the spacers, each region being bounded by first and second seals mounted in spaced apart annular grooves on each engagement surface, the respective engagement surface itself, and an engaged surface of one of the first plate, the second plate, or the frame. A fluid circulation system can include a fluid entry extending from a perimetral surface of each spacer to a center hole of the respective spacer, and a pump arranged to deliver fluid from a supply to the center hole through the respective fluid entry.

A further embodiment of the invention disclosed herein can take the form of an apparatus for forming a plurality of extreme ultraviolet (EUV) pellicles including a first plate with a first electrode and a second plate with a second electrode. A first spacer can include a first engagement surface arranged to engage the first plate. A second engagement surface of the first spacer opposed to the first engagement surface can be arranged to engage a frame supporting an article to be processed into a pellicle. A second spacer can include respective first and second engagement surfaces arranged to engage the frame and one of the second plate or a second frame supporting a respective second article, and a third spacer can include a respective first engagement surface arranged to engage one of the second frame or the second plate. Each engagement surface can include first and second substantially concentric, spaced apart seals mounted in respective first and second substantially concentric, spaced apart grooves in the engagement surface, and a vacuum passage can extend an outer surface of the respective spacer toward a center of the spacer and be in fluid communication with a region between the first and second seals of at least one of the respective first or second engagement surfaces of the respective spacer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

It is noted that the drawings of the invention are not necessarily to scale, are intended to depict only typical aspects of the invention, and therefore should not be considered as limiting the scope of the invention. It is understood that elements similarly numbered between the FIGURES may be substantially similar as described with reference to one another. Further, in embodiments shown and described with reference to FIGS. 1-11, like numbering may represent like elements. Redundant explanation of these elements has been omitted for clarity. Finally, it is understood that the components of FIGS. 1-11 and their accompanying descriptions may be applied to any embodiment described herein.

DETAILED DESCRIPTION

Embodiments of the invention disclosed herein provide an apparatus for processing an article into an extreme ultraviolet (EUV) pellicle including at least a portion of a membrane or film or layer of material that provides at least 70% transmission of EUV radiation, including at least 90% transmission, yet possesses characteristics that render the membrane/film/layer resistant to deflection and/or breakage. The apparatus can include two spacers between which the article can be held. A plate can engage a side of each of the spacers opposite that holding the article, and each plate can include an electrode. A retention system can hold the spacers against the article and the plates against the spacers. A fluid circulation system can enable an electrochemical process to be employed on the article, such as anodization, by which at least a portion of the article can be transformed into a highly EUV-transmissive pellicle. Because of the nature of the electrochemical process(es) employed, multiple articles can be simultaneously processed by using multiple spacers and articles between two plates, so that the components would have a sequence of plate, spacer, article, spacer, article, spacer, article, spacer, . . . , plate. Alternatively, additional groups of a plate and two spacers holding an article can be added in a sequence of plate, spacer, article, spacer, plate, spacer, article, spacer, plate, spacer, article, spacer, . . . , plate, the plates having a sequence of alternating polarity such that a first plate has a first polarity, a second plate has an opposite polarity, a third plate has the first polarity, a fourth plate has the opposite polarity, etc. In each sequence, as many articles and/or spacers and/or plates can be ganged together and/or stacked as can be managed with a particular power supply and/or anodizing solution(s).

Figure 1:
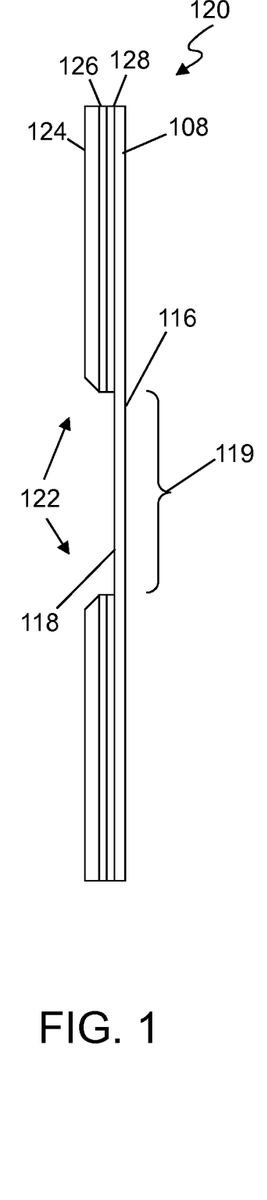
FIG. 1 is a schematic illustration of a cross sectional view of an EUV pellicle processing article that can be used according to an embodiment of the invention disclosed herein.

With reference now to the accompanying drawings, and to FIG. 1 in particular, a pellicle processing structure 120 can include a pellicle layer 108 of semiconductor material supported by a support structure, such as frame 122 formed from a substrate and seen as two legs in cross section. Examples of suitable semiconductor materials for pellicle layer 108 include, but are not limited to, monocrystalline, polycrystalline, and/or amorphous semiconductor material, such as silicon and/or mixtures including silicon, germanium, gallium, indium, and/or other semiconductors, and/or can include dopants, such as boron, phosphorous, and/or arsenic, as may be known in the art. A top surface 116 and a portion of a bottom surface 118 of pellicle layer 108 can be exposed, and an article to be processed, such as pellicle region 119 of pellicle layer 108, can include at least a portion of pellicle layer 108 that overlies the exposed portion of bottom surface 118. Frame 122 can include layers from formation of pellicle layer 108 and frame 122, such as when a SOI wafer is used as a substrate, which can yield a handle wafer portion 124, a BOX layer portion 126, and a substrate layer portion 128. BOX layer 104 can include any suitable insulating material, such as, for example, silicon dioxide.

In embodiments, structure 120 can be substantially circular so that frame 122 can be a single, substantially annular structure, and thus frame 122 can be construed as a frame holding pellicle region 119, and pellicle region 119 can be construed as an article to be processed. While a substantially circular shape has been offered as an example with regard to structure 120, it should be apparent that any other shape can be used as may be desired, suitable, appropriate, and/or available.

Figures 2, 3:
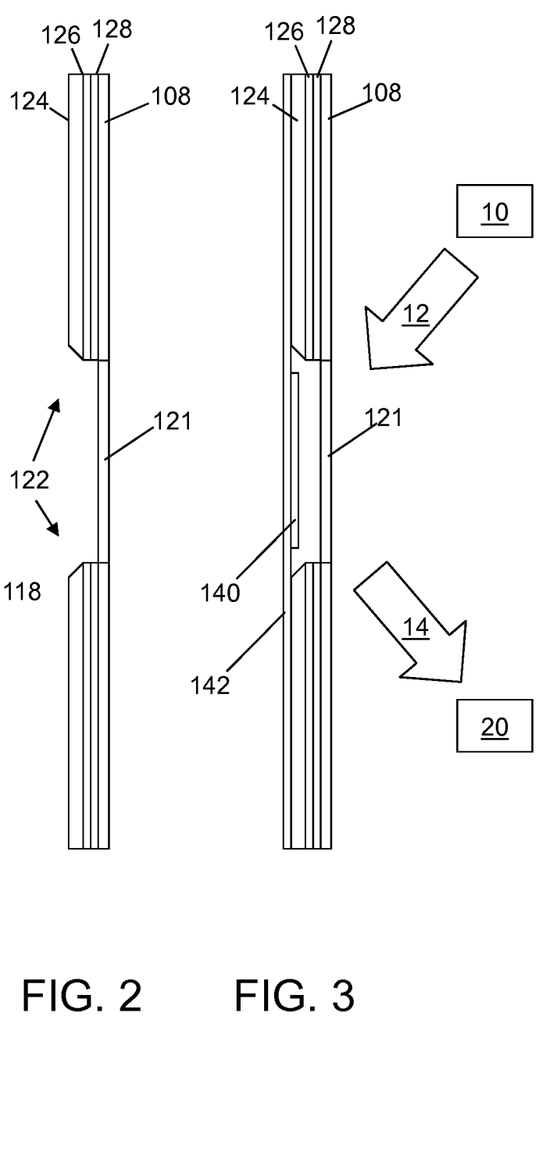
FIG. 2 is a schematic illustration of a cross sectional view of an EUV pellicle processed with an embodiment of the invention disclosed herein.
FIG. 3 is a schematic illustration of a cross sectional view of an EUV pellicle attached to a photomask, the EUV pellicle having been processed with an embodiment of the invention disclosed herein.

Processing structure 120 is particularly suited for processing using embodiments of the invention disclosed herein to form, turning to FIG. 2, a pellicle 121 in pellicle layer 108 from pellicle region 119. As seen in FIG. 3, a photomask 140 to be protected can be attached to pellicle 121, such as by attaching the photomask 140 and/or a support structure 142 thereof to the bottom of frame 122. Attachment can be performed in vacuum or in another environment in which undesirable particles can be eliminated from between pellicle 121 and photomask 140. Attachment can also be achieved by any suitable technique as may be known in the art to substantially permanently attach photomask 140 and/or structure 142 to frame 122, and can include spacer elements selectively placed at the interface between structure 142 and legs 122 so as to create gaps that would ensure that air or other fluid can pass therebetween. An EUV radiation source 10 can then be employed to shine EUV radiation 12 onto photomask 140, which is reflected from photomask 140 as patterned EUV radiation 14 and onto a target 20. As should be apparent, the relative sizes of the layer(s), structure(s), legs, source(s), target(s), and other elements in FIGS. 1-3 are not to scale and have been in at least some cases exaggerated to simplify description.

With reference to FIGS. 4-7, a first example of an apparatus 130 for forming an EUV pellicle is shown in cross section and in exploded cross section and can take the form of an anodizer. Apparatus 130 can be used with a pellicle processing structure, such as processing structure 120 of FIG. 1, to form pellicle 121 (FIG. 2). The apparatus 130, shown disassembled and/or in exploded view in FIG. 4, can include a support structure including at least two spacers 150 between end walls or plates 138 that can form a first chamber 132 and a second chamber 134 on either side of pellicle region 119, which can be supported by frame 122. Each chamber 132, 134 can include a first wall 136 substantially perpendicular to a top or bottom surface of frame 122 and an end wall or plate 138 substantially parallel to top and/or bottom surfaces of frame 122 and substantially perpendicular to first wall 136. In embodiments, as particularly shown in FIG. 4, each spacer 150 can include a respective first engagement surface 152 and a respective second engagement surface 154 arranged and/or configured to engage a respective engagement surface 139 of a respective end wall or plate 138 and/or a respective engagement surface 123, 125 of frame 122. One or more seals 156 can be mounted in grooves 158 or the like in each spacer engagement surface 152, 154 so that chambers 132, 134 can be made fluid-tight by action of a retention system 160 that can draw end walls or plates 138 toward each other as will be described below.

Figure 6:
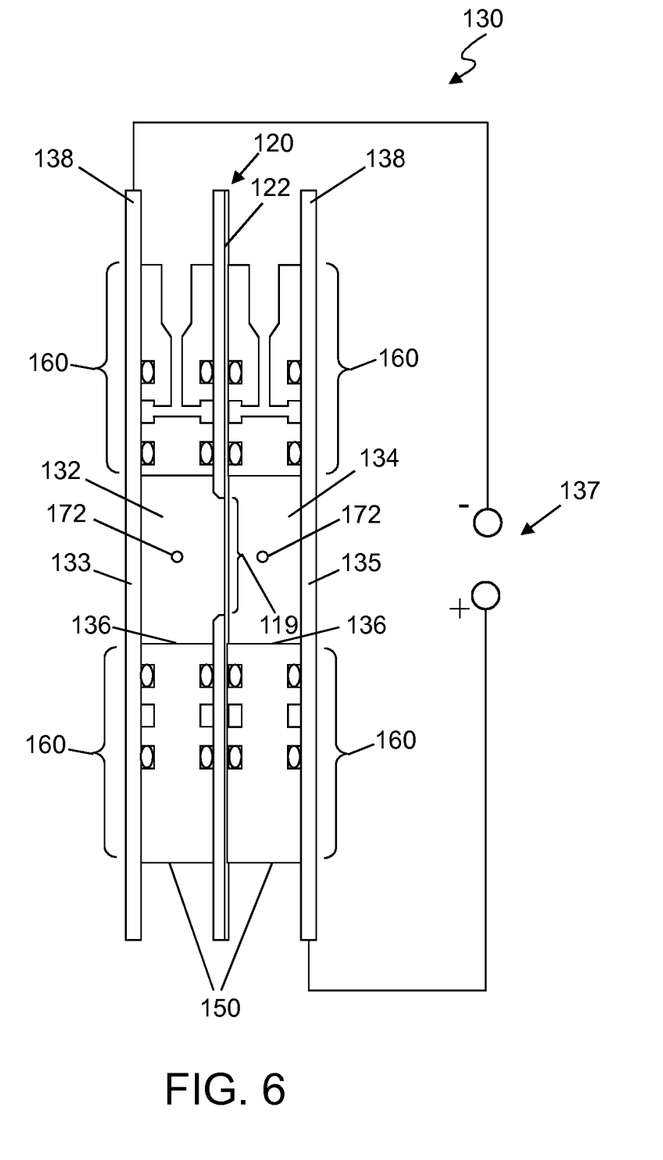
Figure 7:
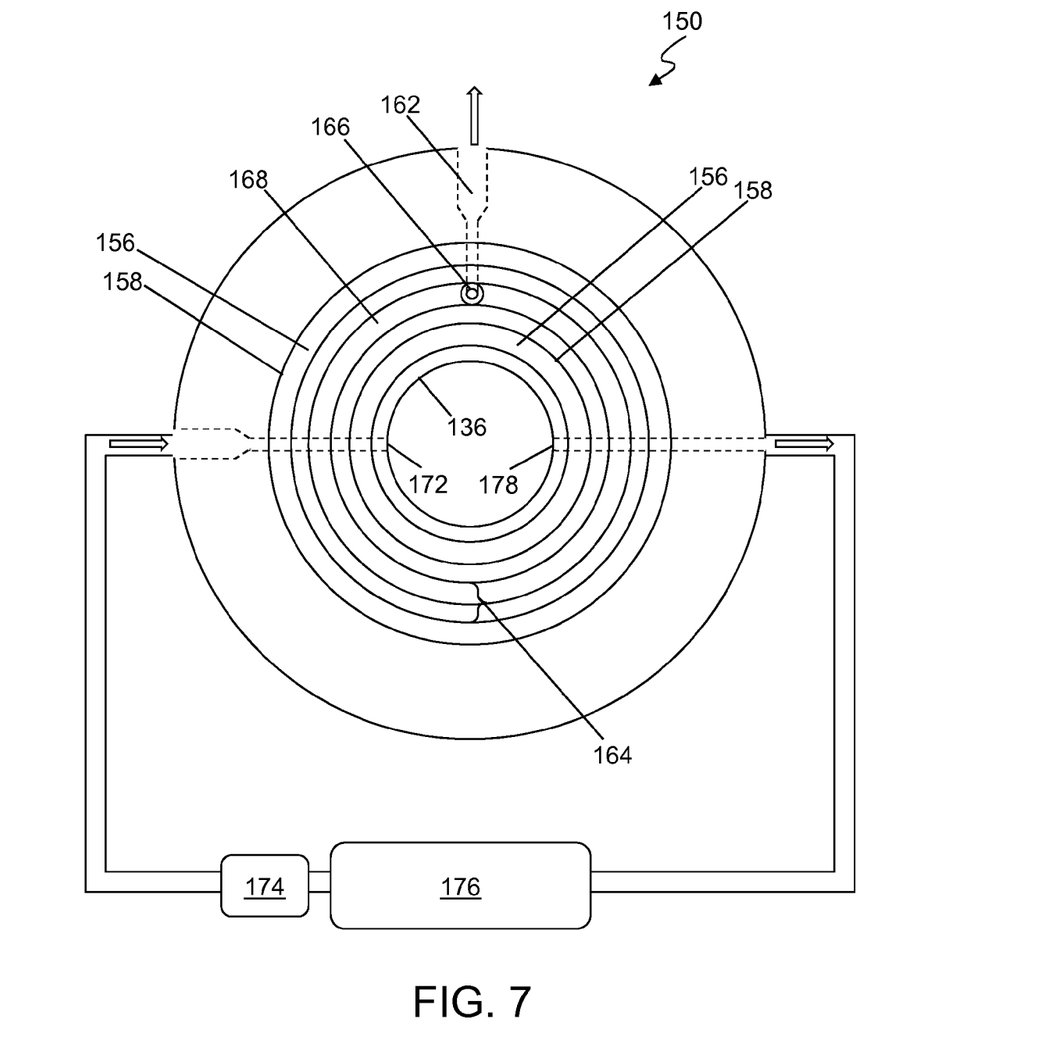
FIG. 7 is a schematic cross sectional illustration of part of an apparatus for forming an EUV pellicle according to an embodiment of the invention disclosed herein.

Each spacer 150, particularly as seen in FIG. 7 (with continuing reference to FIG. 6), can be substantially annular in embodiments such that first wall 136 can be an inner surface of a center hole or passage of a respective spacer 150, chambers 132, 134 can be cylindrical, end wall or plate 138 can be a substantially circular plate or the like, with a respective surface of pellicle region 119 exposed to an interior of respective chamber 132, 134. Again, while a particular shape may be offered as an example in describing an element of embodiments of the invention disclosed herein, it should be apparent that any shape can be used as may be desired, suitable, appropriate, and/or available.

Figure 4:
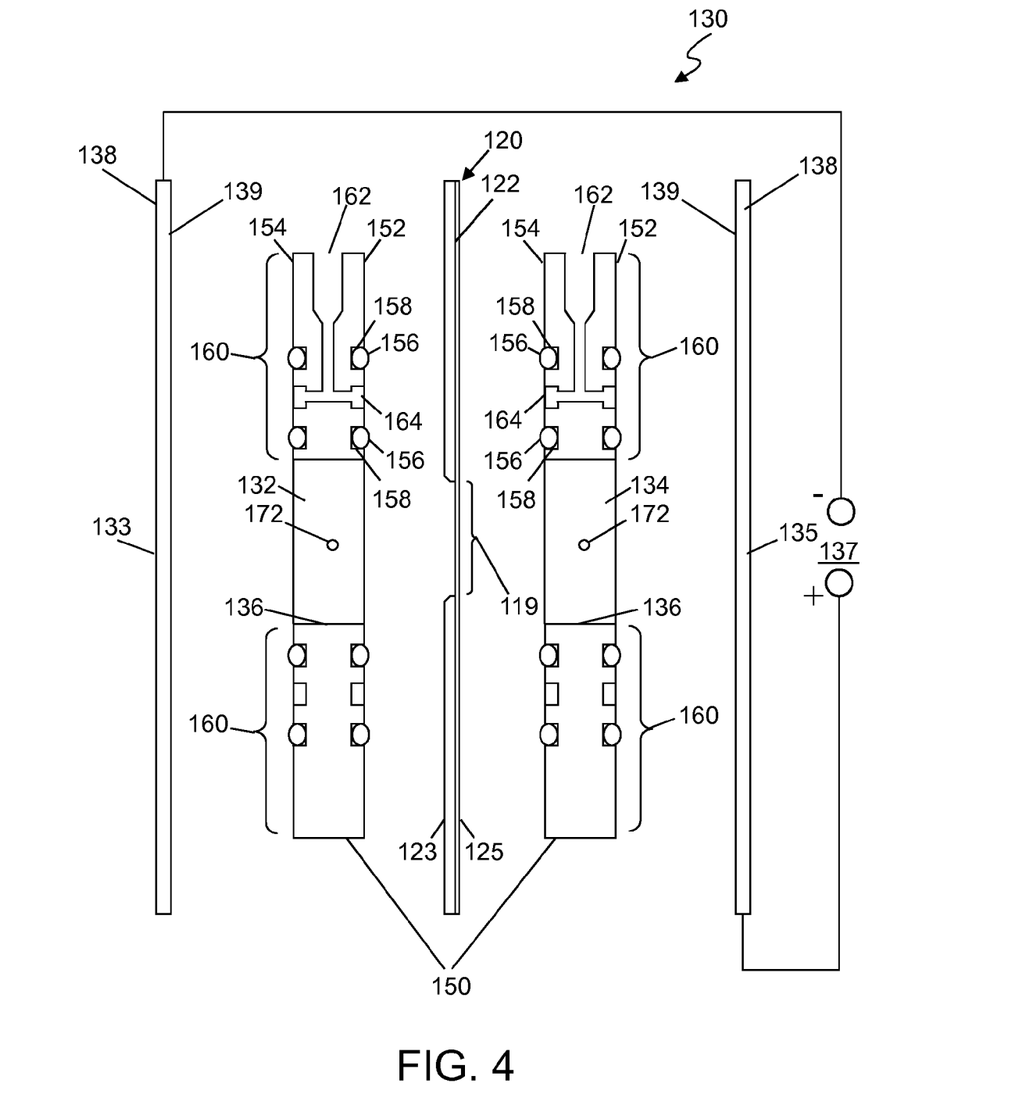
FIGS. 4-6 are schematic cross sectional diagrams of a first example of an apparatus for forming an EUV pellicle according to an embodiment of the invention disclosed herein.
Figure 5:
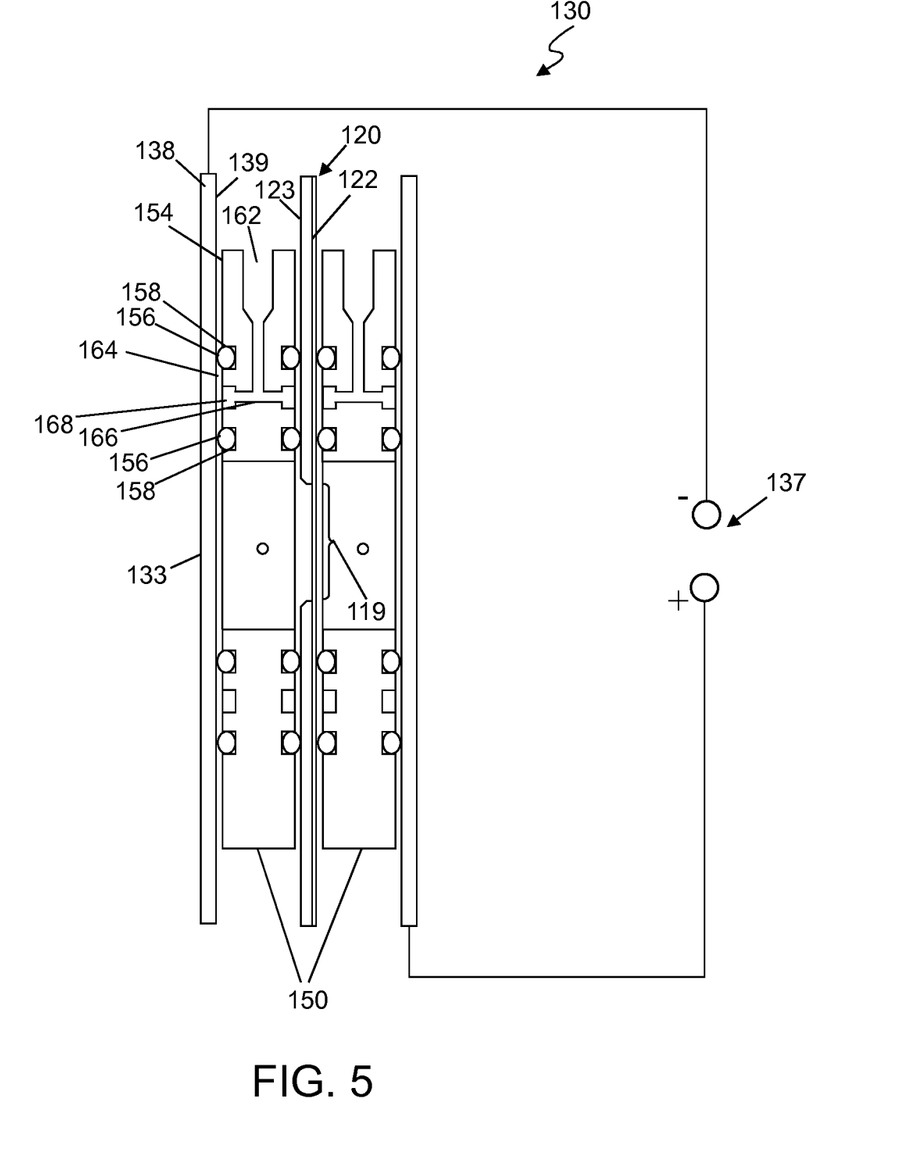

In embodiments, at least a portion of each end wall or plate 138 can also be electrically conductive and can form an electrode 133, 135 for a respective chamber 132, 134. It should be apparent that additional walls and/or seals would be needed to form fluid-tight chambers 132, 134 of various shapes and so other shapes are well within the scope of embodiments of the invention disclosed herein. In FIGS. 4-6, for example, each end wall or plate 138 can be substantially circular and at least a central portion can be electrically conductive and connected to a voltage source 137 as a cathode 133 or an anode 135. For example, each plate 138 can be formed from a metal, a semiconductor, and/or mixtures of metals, semiconductors, and/or other materials. In an embodiment, each plate 138 can be formed from a semiconductor wafer or the like, such as a silicon wafer, and can include a dopant, such as boron, phosphorous, and/or arsenic as non-limiting examples, to enhance conductivity in at least the central region. However, one or both of electrodes 133, 135 can instead be a separate part(s) in a region of a respective chamber 132, 134 distal from article 119. Each spacer 150 can be formed from a substantially electrically insulating material, particularly where an end wall or plate 138 includes a conductive portion where it would contact a spacer 150. Together, electrodes 133, 135 and voltage source 137 can be construed as a charging system of embodiments.

As suggested above, each spacer 150 in embodiments can also include at least a portion of a retention system 160. FIGS. 4-7, and particularly FIG. 5, show that each spacer 150 can include a first vacuum passage 162 extending from an outer surface of spacer 150 toward a center of spacer 150 and in fluid communication with a region 164 of and/or adjacent to a respective engagement surface 154 between two respective seals 156, and a respective engagement surface 139 of an end wall or plate 138 so that, when exposed to vacuum or at least reduced local pressure in first vacuum passage 162, engagement surface 154 and engagement surface 139 are drawn together. While a single region 164 is highlighted and described in FIG. 5, it should be clear that corresponding regions 164 can be formed between all mutually engaging surfaces and their respective seals in apparatus 130. In addition, where spacer 150 is substantially annular, each region 164 can also be substantially annular.

First vacuum passage 162 can extend from a perimetral surface of spacer 150 toward a center of spacer 150, and a second vacuum passage 166 can enable fluid communication between first vacuum passage 162 and region(s) 164. In embodiments, second vacuum passage 166 can connect first vacuum passage 162 to a groove 168 in each engagement surface 152, 154 of a respective spacer 150. For example, second vacuum passage 166 can be a through hole formed to extend between a groove 168 in one engagement surface 152 and a corresponding groove 168 in the other engagement surface 154, also crossing first vacuum passage 162. While described as two vacuum passages, it should be clear that first and second vacuum passages 162, 166 could be construed as a single vacuum passage. For example, a spacer 150 could be formed from a polymeric material by a process that could allow a relatively complex shape for vacuum passage 162 and/or vacuum passage 166 such that a single passage could be formed. In embodiments where spacer(s) 150 is substantially annular, groove(s) 158 can be substantially annular, as well, as can groove(s) 168. In addition, seals 156 can include, for example, concentric, elastomeric O-rings mounted in concentric grooves 158 with a respective groove 168 therebetween. Each spacer 150, as suggested above, can be made from a polymeric material by any suitable method, and some non-limiting examples of polymeric materials can include polyethylene, polytetrafluoroethylene, polystyrene, polypropylene, polyvinyl chloride, nylon, and polyurethane, though other polymeric materials can be used as may be desired and/or suitable.

When end walls or plates 138, spacers 150, and structure 120 are stacked substantially as shown in FIG. 5 and vacuum is applied via first vacuum passage 162, apparatus 130 can assume an assembled state such as is shown in FIG. 6, in which each chamber 132, 134 is fluid-tight as a result of the interaction of seals 156 and engagement surfaces 123, 125, 139, 152, 154. An anodizing solution can then be supplied to each chamber 132, 134, such as via fluid entry 172, so as to contact exposed portions of surfaces 116, 118 of pellicle region 119, and effectively creating a dual-chambered electrochemical cell. The anodizing solution can include any suitable fluid and/or formulation as may be known in the art of electrochemistry that can induce pore formation in pellicle region 119, such as by selective electrochemical dissolution, when electrodes 133, 135 are energized. For example, hydrofluoric acid can be included in the anodizing solution, and particularly in a mixture of hydrofluoric acid, water, and/or alkanols, such as methanol, ethanol, and/or isopropanol. As should be apparent, a switch or the like can be included to selectively energize the electrodes.

With particular reference to FIG. 7 and continuing reference to FIGS. 4-6, noting that not all elements are visible in all of FIGS. 4-7, one or both chambers 132, 134 (FIGS. 4-6) can include a respective fluid entry 172, which can also act as a fluid exit, in fluid communication with or otherwise connected to a pump 174 and/or reservoir 176 of anodizing solution(s) as part of a fluid circulation system 170. In other embodiments one or both chambers can also include a fluid exit 178 also in fluid communication with or otherwise connected to pump 174 and/or reservoir 176 of anodizing solution(s). Whether a chamber 132, 134 (FIGS. 4-6) includes only fluid entry 172 or also includes fluid exit 178, anodizer 130 can be used, for example, by filling one or both chambers 132, 134 (FIGS. 4-6) with anodizing solution to at least immerse a respective surface of article 119 and respective electrode 133, 135 (FIGS. 4-6), which can be energized until the anodizing solution is chemically depleted and/or otherwise no longer suitable, and/or until an objective is achieved. Some non-limiting examples of such objectives can include a particular thickness of pellicle region 119 (FIGS. 4-6), elapse and/or passage of a particular period, a particular range of pore sizes, and/or a particular transmissivity of pellicle region 119 (FIGS. 4-6) to a particular range of wavelengths/frequencies of electromagnetic radiation.

The anodizing solution can then be removed, and, if necessary, filling chamber(s) 132, 134 (FIGS. 4-6) and energizing electrode(s) 133, 135 (FIGS. 4-6) can be repeated. It should be clear that each spacer 150 can be connected to a respective pump 174 and/or reservoir 176, though in embodiments, a plurality or even all of spacers 150 can be connected to a single pump 174 and/or reservoir 176. It should be apparent that fluid circulation system 170 can also include additional elements, such as valves and/or conduits, that can enable chambers 132, 134 (FIGS. 4-6) to be filled with anodizing solution, emptied, and/or rinsed within the scope of embodiments of the invention disclosed herein.

In embodiments where one or both chambers 132, 134 (FIGS. 4-6) include a fluid entry/exit pair 172, 178, anodizer 130 can be used with pump 174 to circulate anodizing solution along and/or against a respective surface of pellicle region 119. Thus, referring again to FIGS. 4-6, to anodize pellicle region 119 in such embodiments, electrodes 133, 135 can be energized while anodized solution flows and/or circulates past and/or against and/or along top surface 116 (FIG. 1) and/or bottom surface 118 (FIG. 1) until an objective is achieved. Again, examples of such an objective can include until a desired thickness of pellicle region 119 is reached, until a particular period has elapsed and/or passed, until pores of a particular range of sizes have formed in pellicle region 119, and/or until a desired transmissivity to electromagnetic radiation in a particular range of wavelengths (and/or corresponding frequencies) has been achieved in pellicle region 119. For example, anodizing can continue until a thickness of pellicle region 119 of from about 1 micron to about 2.5 microns has been reached, until a period of from about 1 to about 1000 seconds has passed or elapsed, until pores of from about 1 nanometer to about 100 nanometers in sized have formed in pellicle region 119, and/or until a transmissivity of at least 70% to electromagnetic radiation in a range of wavelengths of from about 4 nanometers to about 125 nanometers (and/or in a range of frequencies of from about 1 PHz to about 75 PHz) has been achieved in pellicle region 119.

Figure 8:
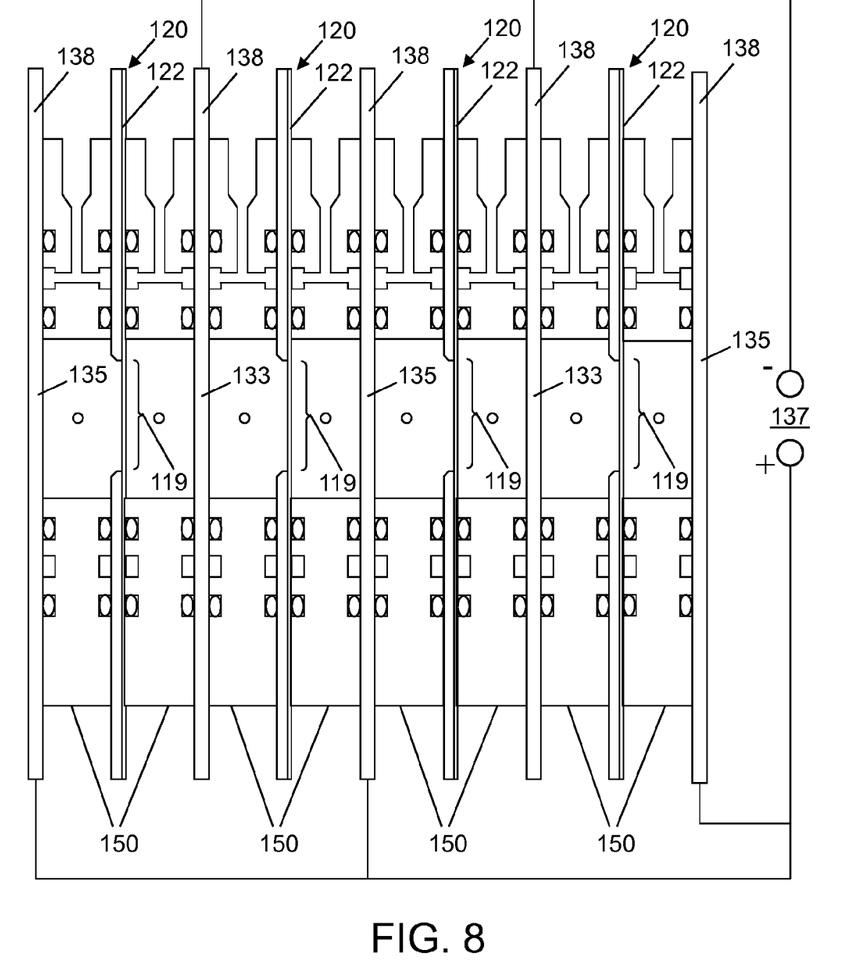
FIG. 8 is a schematic cross sectional diagram of a second example of an apparatus for forming an EUV pellicle according to an embodiment of the invention disclosed herein.
Figure 9:
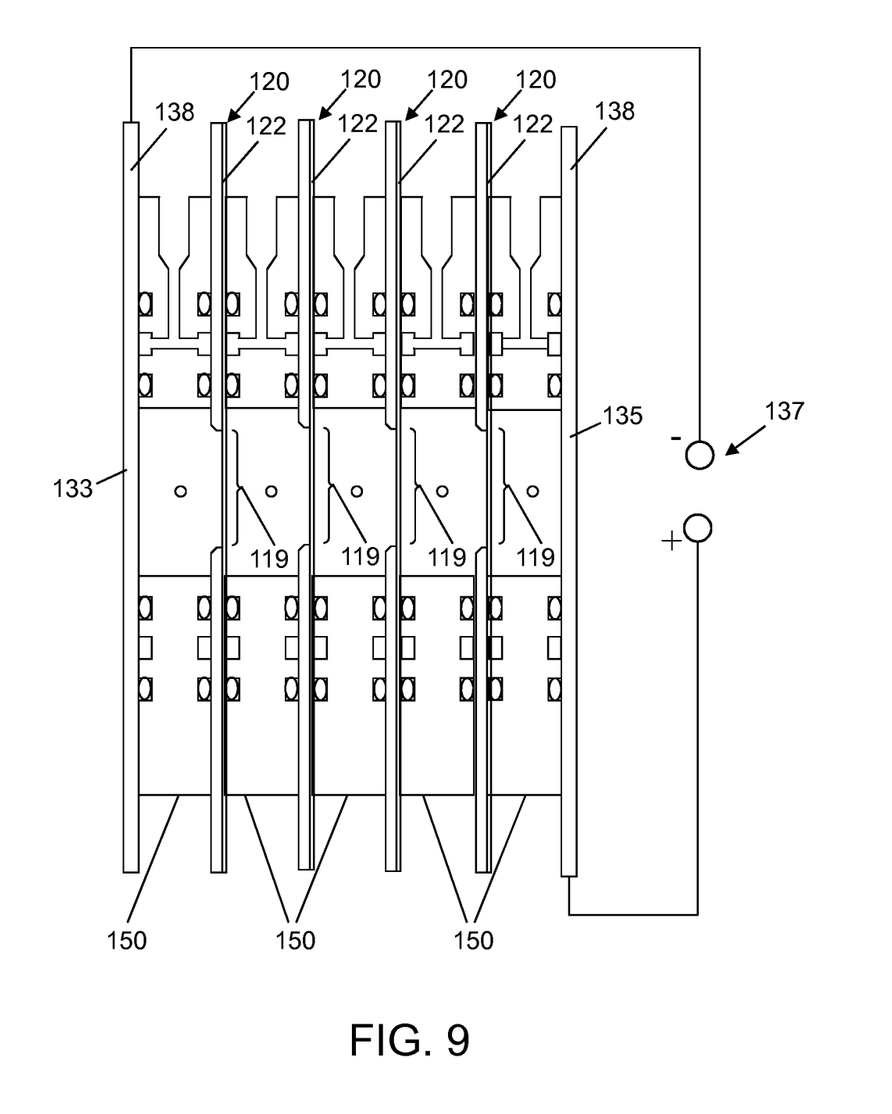
FIG. 9 is a schematic cross sectional diagram of a third example of an apparatus for forming an EUV pellicle according to an embodiment of the invention disclosed herein.

In embodiments, as shown in FIGS. 8 and 9, apparatus 130 can be used to process multiple articles 119 substantially simultaneously. For example, as seen in FIG. 8, one or more additional pairs of spacers 150 can be stacked from one of the end walls or plates 138 of the example show in FIGS. 4-6, each pair holding a respective structure 120, and an additional end wall or plate 138 can be added for each pair of spacers 150. Thus, a third end wall or plate 138 substantially identical to the first end wall or plate 138, a third spacer 150 substantially identical to the second spacer 150, and a fourth spacer 150 substantially identical to the first spacer 150 can be added to the example of FIGS. 4-6 such that a first engagement surface of the third spacer engages the second plate, a second engagement surface of the third spacer engages a second frame, a first engagement surface of the fourth spacer engages the second article, and a second engagement surface of the fourth spacer engages the third plate. As many additional spacer pairs and respective plates can be added as may be suitable and/or desired, with electrodes alternating polarity. Thus, looking from right to left in FIG. 8, an order can include plate, spacer, article, spacer, plate, spacer, article, spacer, plate, spacer, . . . , plate, with plates including electrodes of a first polarity, opposite polarity, first polarity, and so forth. A single voltage source 137 can be used as shown, or multiple such voltage sources can be employed, depending on the requirements of a particular implementation and/or as might otherwise be desired and/or suitable.

Another example shown in FIG. 9 can use two end walls or plates 138 with additional spacers 150 and respective structures 120 between each pair of spacers 150. Thus, the example shown in FIGS. 4-6 can be modified by placing an additional structure 120 against one of the spacers 150 where an end wall or plate 138 is shown in FIGS. 4-6, adding a spacer 150 on the other side of the additional structure 120, and placing the moved end wall or plate 138 against the added spacer 150. As many additional structures 120 and spacers 150 can be added between two end walls or plates 138 as may be suitable and/or desired. In the example shown in FIG. 9, an order can include end wall or plate, spacer, article, spacer, article, spacer, article, . . . , spacer, end wall or plate.

As above with the example of FIGS. 4-6, it should be clear that fluid entry 172 of each spacer 150 in the examples of FIGS. 8 and 9 can be connected to a respective pump 174 and/or reservoir 176, though in embodiments, a plurality or even all of spacers 150 can be connected to a single pump 174 and/or reservoir 176. It should also be apparent that fluid circulation system 170 can also include additional elements, such as valves and/or conduits, that can enable chambers 132, 134 to be filled with anodizing solution, emptied, rinsed, and/or subjected to any other fluid-related activity within the scope of embodiments of the invention disclosed herein.

Figure 10:
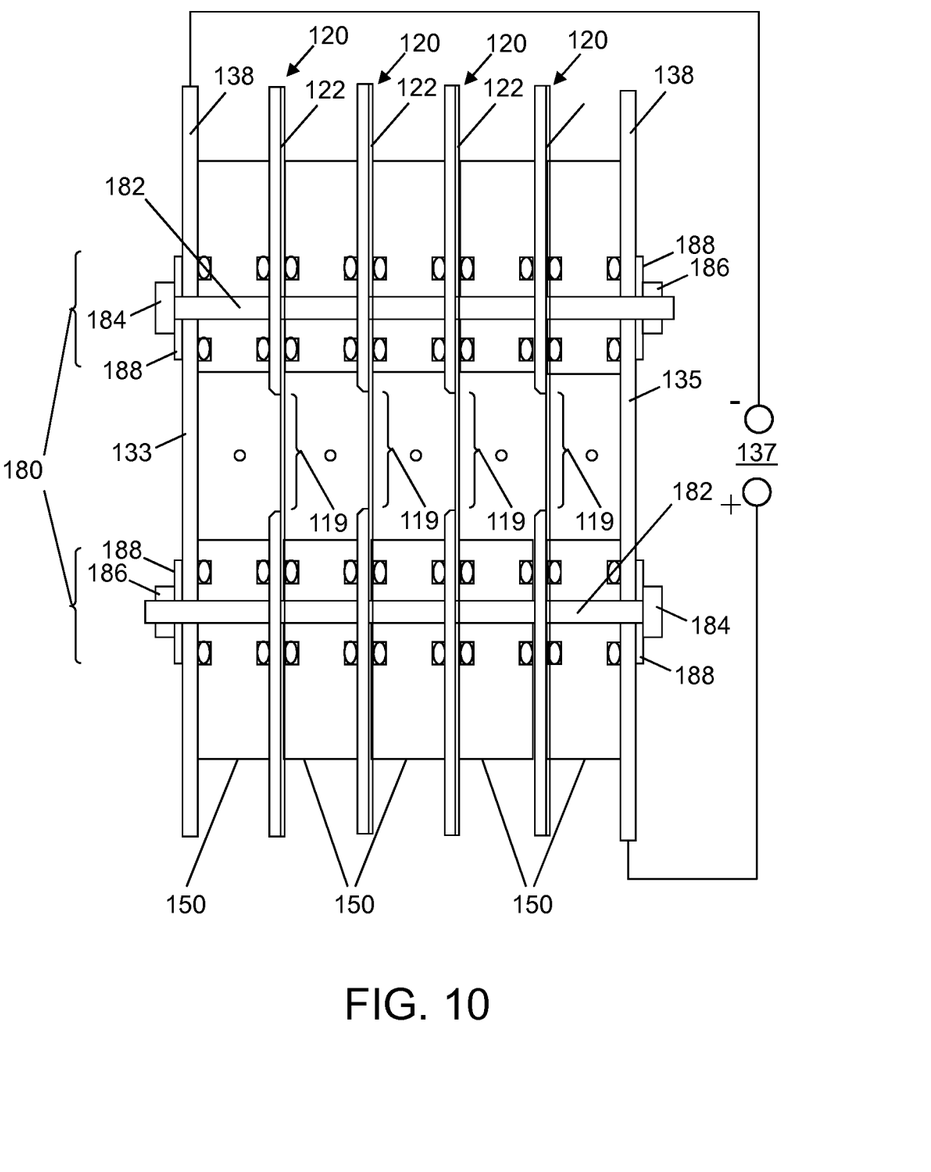
FIG. 10 is a schematic cross sectional diagram of the third example of an apparatus for forming an EUV pellicle according to an embodiment of the invention disclosed herein using an alternate retention system.

An additional example seen in FIG. 10 includes the spacer, article, and end wall or plate arrangement of FIG. 9, but illustrates an alternate form of a retention system that can be used in embodiments. As shown, alternate retention system 180 can include bolts 182 or the like extending through spacers 150 and end walls or plates 138. One end of each bolt 182 can include a head 184, while the other end of each bolt 182 can engage a nut 186. One or more washers 188 can be interposed between one or both of head 184 or nut 186 and a respective end wall or plate 138 to better distribute pressure when bolt 182 and/or nut 186 are screwed together to draw end walls or plates 138 together to seal chambers 132, 134, etc. While bolts and nuts have been shown, it should be clear that many other devices could be used as alternate retention system 180, such as, for example, clamps, (electro)magnets, a press, a vise, and/or weight(s) with apparatus 130 rotated ninety degrees, within the scope of embodiments of the invention disclosed herein. In addition, while two bolts 182 are shown with opposite orientations, it should be clear that as many bolts 182 can be employed and distributed and arranged in whatever orientation(s) may be suitable and/or desired for a particular implementation of apparatus 130 according to embodiments. Further, it should be clear that an alternate retention system 180 can be used with any implementation of apparatus 130, including, but not limited to, all of the examples shown in FIGS. 4-10.

Figure 11:
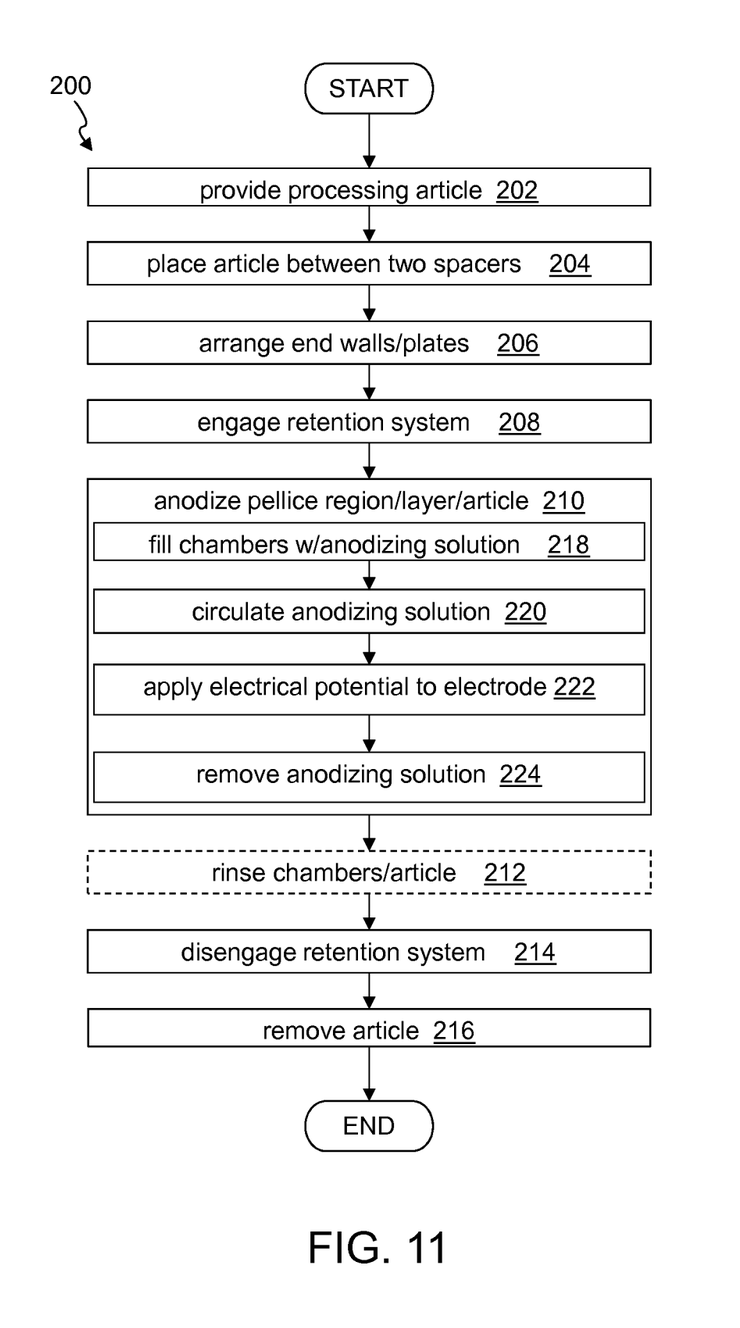
FIG. 11 is a schematic flow diagram of a method of using an apparatus for forming an EUV pellicle according to an embodiment of the invention disclosed herein.

An example of a method of using apparatus 130 according to embodiments of the invention disclosed herein to form an EUV pellicle is seen in FIG. 11. Broadly, a processing article can be provided (block 202), which can include a pellicle region of a pellicle layer, and placed between two spacers (block 204). End walls and/or plates can be arranged (block 206) and the retention system can be engaged (block 208) to draw engagement surfaces together and form fluid-tight chambers. The article can then be anodized (block 210), the chambers and/or article can be rinsed (block 212, optional), if necessary, the retention system can be disengaged (block 214), and the article can be removed (block 216). Anodizing the article (block 210) can include filling the chambers with anodizing solution (block 218), circulating the solution if desired/capable (block 220), applying an electrical potential to the electrodes (block 222) until an objective is reached, and removing the anodizing solution (block 224). In embodiments in which the chamber is simply filled with anodizing solution, if the solution becomes depleted or otherwise unsuitable before the objective is achieved, filling the chamber, applying electrical potential, and removing the solution can be repeated until the objective is achieved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for processing an article into an extreme ultraviolet (EUV) pellicle for protection of a photomask, the apparatus comprising:
    a first plate including a first electrode arranged for connection to a voltage source;
    a second plate including a second electrode arranged for connection to the voltage source;
    a first spacer having a center hole and opposed first and second engagement surfaces, the first engagement surface being arranged to engage the first plate and the second engagement surface being arranged to engage a first frame supporting the article, thereby forming a first chamber;
    a second spacer substantially identical to the first spacer, a first engagement surface of the second spacer being arranged to engage the first frame, and a second engagement surface of the second spacer being arranged to engage the second plate, thereby forming a second chamber;
    first and second substantially concentric, substantially coplanar seals spaced apart in respective first and second grooves in each of the first and second engagement surfaces of the first and second spacers and arranged to substantially prevent fluid leakage from each respective one of the first and second chambers; and
    a respective vacuum passage extending from an outer surface of each of the first and second spacers toward the respective center hole and in fluid communication with a region of each of the respective first and second engagement surfaces between the respective first and second seals so as to retain the first and second plates and the frame in engagement with the seals and the engagement surfaces of the spacers.

2. The apparatus of claim 1, wherein each of the first and second engagement surfaces of the first and second spacers includes a third groove formed between the respective first and second seals, the respective vacuum passage being in fluid communication with the third groove.

3. The apparatus of claim 1, wherein each of the first and second spacers includes a respective fluid entry extending from the respective outer surface of each spacer to a respective one of the first and second chambers.

4. The apparatus of claim 3, wherein each of the first and second spacers further includes a respective fluid exit extending from a respective one of the first and second chambers to a respective outer surface of each spacer.

5. The apparatus of claim 1, further comprising at least one additional spacer and a respective at least one additional frame between each pair of spacers so that a respective article supported by each respective additional frame is between the first and second plates.

6. The apparatus of claim 1, further comprising at least an additional plate, and at least an additional pair of spacers substantially identical to the first spacer and arranged to engage at least one respective additional frame supporting a respective additional article, an engagement surface of a spacer of each of the at least an additional pair of spacers being arranged to engage the second plate, and another engagement surface of another spacer of the at least an additional pair of spacers being arranged to engage the at least an additional plate such that consecutive plates include electrodes of opposite polarities.

7. The apparatus of claim 1, wherein the first and second spacers are substantially annular, the first and second seals are O-rings, and the first and second grooves are substantially annular.

8. The apparatus of claim 7, wherein the first and second plates are electrically conductive and act as the respective first and second electrodes.

9. An apparatus for processing an article to form a pellicle for protecting a photomask, the apparatus comprising:
    a support structure including first and second substantially identical, substantially annular spacers arranged to engage and hold a first frame therebetween, the first frame supporting the article, each of the first and second spacers including opposed engagement surfaces;
    a first plate engaged by a first engagement surface of the first spacer;
    a second plate engaged by a second engagement surface of the second spacer;
    a retention system including a vacuum supply in fluid communication with a respective region of each engagement surface of the spacers, each region being bounded at least in part by first and second seals mounted in spaced-apart annular grooves on each engagement surface, the respective engagement surface itself, and an engaged surface of one of the first plate, the second plate, or the frame; and a fluid circulation system including a fluid entry extending from a perimetral surface of each spacer to a center hole of the respective spacer, and a pump arranged to deliver fluid from a supply to the center hole through the respective fluid entry.

10. The apparatus of claim 9, further comprising a voltage source in electrical communication with the first and second plates, an anode of the voltage source in electrical communication with one of the first and second plates, and a cathode of the voltage source in electrical communication with the other of the first and second plates.

11. The apparatus of claim 9, further comprising at least a third spacer between the second spacer and the second plate arranged to engage the second plate and arranged with the second spacer to support a second frame therebetween, the third spacer being substantially identical to the first spacer.

12. The apparatus of claim 9, further comprising a third plate, at least a third spacer substantially identical to the first spacer and a fourth spacer substantially identical to the second spacer, the third and fourth spacers being arranged to engage and support a second frame therebetween and between the second plate and the third plate, an engagement surface of the third spacer being arranged to engage the second plate, and an engagement surface of the fourth spacer being arranged to engage the third plate.

13. The apparatus of claim 12, further comprising at least one additional plate and at least one additional pair of spacers arranged to hold a respective additional frame therebetween, the first, second, third, and at least one additional plates being arranged with each plate having an opposite polarity of at least one adjacent plate.

14. The apparatus of claim 9, wherein the first and second spacers are formed from a substantially electrically insulating material.

15. The apparatus of claim 14, wherein the substantially electrically insulating material includes a polymer.

16. The apparatus of claim 9, wherein the first and second plates are made from a material including a semiconductor.

17. An apparatus for forming a plurality of extreme ultraviolet (EUV) pellicles, the apparatus comprising:
a first plate including a first electrode;
a second plate including a second electrode;
a first spacer including a first engagement surface arranged to engage the first plate, and a second engagement surface opposed to the first engagement surface and arranged to engage a first frame supporting a first article to be processed into a first pellicle;
a second spacer including a respective first engagement surface arranged to engage the first frame, and a respective second engagement surface arranged to engage one of the second plate or a second frame supporting a respective second article;
a third spacer including a respective first engagement surface arranged to engage one of the second frame or the second plate;
first and second substantially concentric, spaced-apart seals mounted in respective first and second substantially concentric, spaced-apart grooves in each respective engagement surface of each spacer; and
a vacuum passage in each spacer extending from an outer surface of the respective spacer toward a center of the respective spacer, the respective vacuum passage being arranged for fluid communication with a respective region between the respective first and second seals of at least one of the respective first or second engagement surfaces of the respective spacer.

18. The apparatus of claim 17, wherein the second engagement surface of the second spacer is arranged to engage the second frame, the first engagement surface of the third spacer is arranged to engage the second frame, and a respective second engagement surface of the third spacer is arranged to engage the second plate.

19. The apparatus of claim 17, wherein the second engagement surface of the second spacer is arranged to engage the second plate, the first engagement surface of the third spacer is arranged to engage the second plate, a respective second engagement surface of the third spacer is arranged to engage the second frame, and further comprising a third plate and a fourth spacer substantially identical to the first spacer, a respective first engagement surface of the fourth spacer being arranged to engage the second frame, and a respective second engagement surface of the fourth spacer being arranged to engage the third plate.

20. The apparatus of claim 17, wherein each spacer includes a respective center hole arranged to form a respective fluid-tight chamber with respective surfaces engaged by the respective spacer, and a fluid entry extends from the outer surface of the respective spacer to the center hole of the respective spacer.

* * * * *